United States Patent [19]

Chapman et al.

[11] 4,451,930
[45] May 29, 1984

[54] PHASE-LOCKED RECEIVER WITH DERIVED REFERENCE FREQUENCY

[75] Inventors: Ronald H. Chapman, Wheaton; Andrew F. Peterson, Schaumburg, both of Ill.

[73] Assignee: Motorola Inc., Schaumburg, Ill.

[21] Appl. No.: 403,972

[22] Filed: Aug. 2, 1982

[51] Int. Cl.³ .............................................. H04B 1/26
[52] U.S. Cl. ..................... 455/260; 375/97; 455/51; 455/265; 455/316
[58] Field of Search ............... 455/260, 265, 315, 316, 455/51, 75; 375/81, 97

[56] References Cited

U.S. PATENT DOCUMENTS

| | | |
|---|---|---|
| 3,611,175 | 10/1971 | Boelke . |
| 3,746,991 | 7/1973 | Gautney . |
| 3,927,373 | 12/1976 | Janssens . |
| 4,035,833 | 7/1977 | Shepard . |
| 4,117,405 | 9/1978 | Martinez . |
| 4,119,912 | 10/1978 | Nary et al. . |
| 4,135,164 | 1/1979 | Kurata ................................ 455/265 |
| 4,208,630 | 6/1980 | Martinez . |
| 4,314,208 | 2/1982 | Munday . |
| 4,355,404 | 10/1982 | Uzunoglu ............................. 375/97 |

OTHER PUBLICATIONS

Article from IEEE Transactions on Communication Technology, pp. 449-452, Aug. 1970 Issue.

Primary Examiner—Marc E. Bookbinder
Attorney, Agent, or Firm—Rolland R. Hackbart; James W. Gillman; Edward M. Roney

[57] ABSTRACT

An improved phase locked loop receiver for use in a simulcast transmission system is disclosed whereby the phase locked loop receiver is used as a means to distribute a common reference frequency to all of the transmitters in a simulcast system. By phase locking the link receivers at each of the simulcast transmitters to the carrier of the link transmitter, a common reference is obtained. This allows each of the synthesized simulcast transmitters to be phase locked to a common reference. The Phase Locked Receiver (PLR) uses a reference frequency derived from the receiver IF frequency. The injection oscillator of the receiver is phase locked to this reference.

14 Claims, 4 Drawing Figures

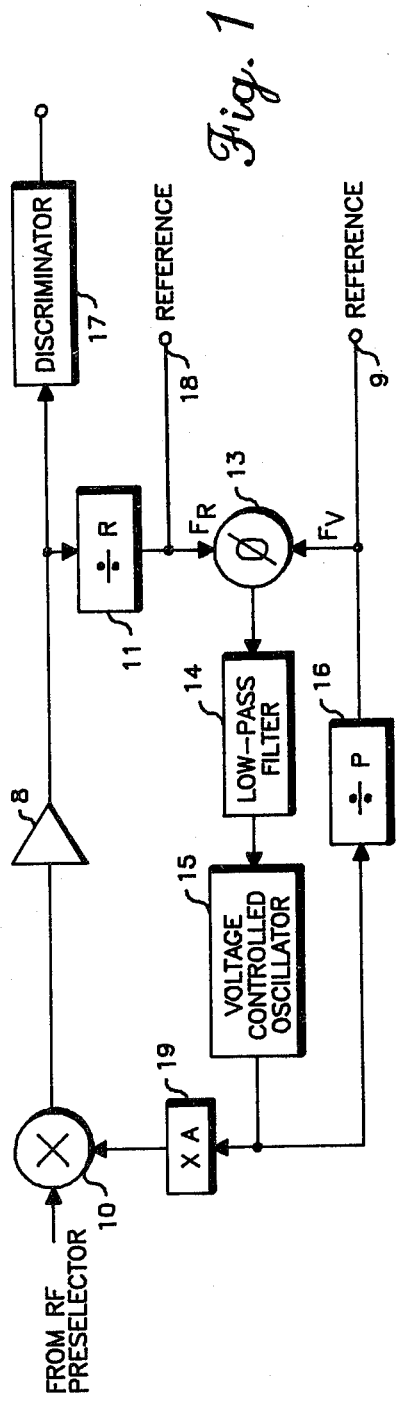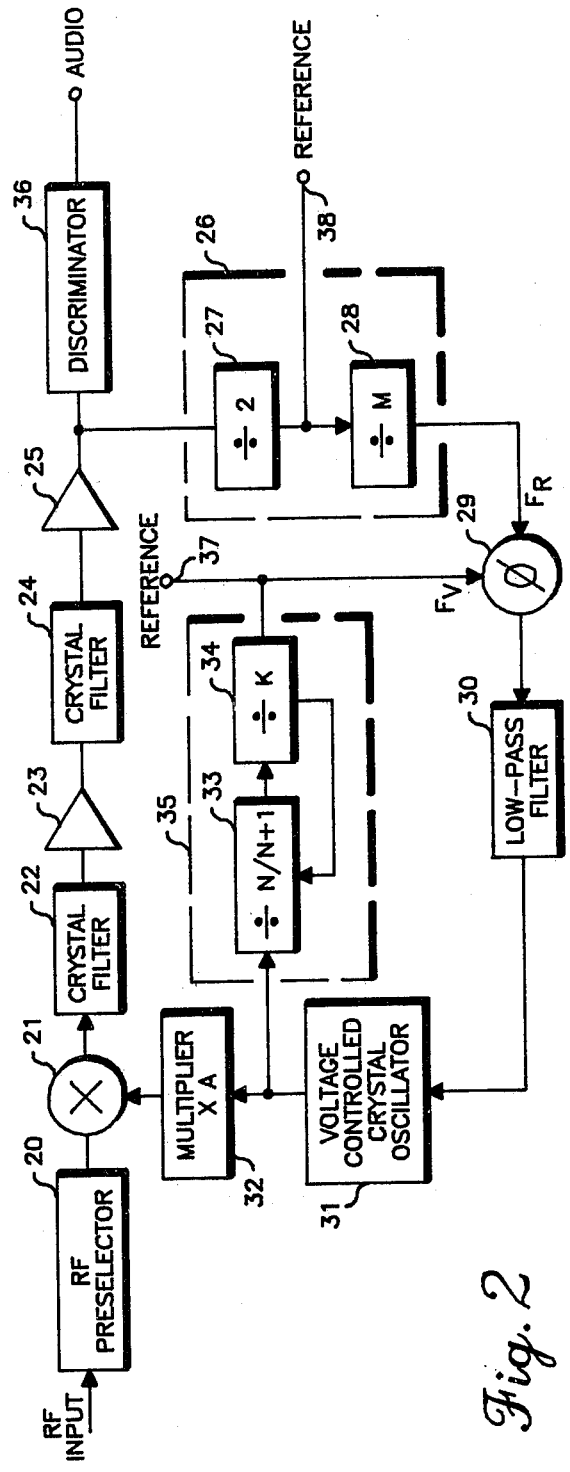

PHASE-LOCKED RECEIVER WITH DERIVED REFERENCE FREQUENCY

BACKGROUND OF THE INVENTION

1. Field of the Invention

This invention relates generally to the field of simulcast transmission systems and specifically to a phase-locked receiver which is used to distribute reference frequency and audio signals to the trasmitters of a simulcast transmission system.

2. Description of the Prior Art

Simulcast transmission systems have been developed as a method for obtaining wide broadcast storage in a large area with a diverse topology. Typically, these systems incorporate several transmitters which are placed a great distance from each other as determined by the constraints of a particular area. Simulcast systems require that each transmitter produce substantially the exact same signal. Any variation in the signals being transmitted in the system will result in various types of distortion in the signal delivered to a receiver. This requires that every transmitter in a simulcast system produce a signal of substantially identical frequency and substantially identical modulation.

Certain simulcast systems in the past have used high stability quartz crystal oscillators to control the transmitters' operating frequency and microwave modems and microwave systems have been used to distribute the audio. An alternate approach to a simulcast system is disclosed in U.S. Pat. No. 4,188,582 and is assigned to the assignee of the present invention. This system utilizes a reference oscillator driving a microwave transmitter. The signal from the microwave transmitter is then conveyed to a plurality of microwave receivers which drive lower frequency transmitters which are phase-locked to the microwave receivers thus providing a plurality of transmitters which are operating at relatively the same frequency. These systems operate within generally acceptable specifications, but the described system is quite complex and requires periodic adjustments to maintain system performance.

For the foregoing and other shortcomings and problems, there has been a long felt need to reduce the complexity and maintenance of a simulcast system while maintaining the transmitters at less than the allowable frequency difference.

SUMMARY OF THE INVENTION

Accordingly, it is an object of the present invention to provide a phase-locked receiver with an output which is coherent with the signal at its input.

It is a further object of this invention to provide an improved phase-locked receiver which can be used to derive a common reference frequency which can be provided to a transmitter in a simulcast system.

It is yet a further object of this invention to provide a receiver with a phase-locked loop which emits a very low harmonic frequency output near the receiver IF frequency, thereby allowing the receiver to utilize a high gain IF section.

It is yet a further object of this invention to provide a receiver to be used in a simulcast transmission system which will operate at less than allowable frequency difference without periodic maintenance.

Briefly described, the invention contemplates a phase-locked receiver which utilizes the divided IF frequency as the reference input to a phase-locked loop. The output of the voltage controlled oscillator of the phase-locked loop is then used as the injection to the mixer of the phase-locked loop receiver. The output frequency of the phase-locked receiver is then phase-locked to the input carrier frequency of the receive. By placing a divide-by-two divider very close to the IF output of the receiver, the phase-locked loop harmonic frequency emission near the IF frequency of the receiver is greatly reduced.

Additional features, objects and advantages of the phase-locked loop receiver, in accordance with the present invention will be more clearly understood from the following detailed description together with the accompanying drawings.

BRIEF DESCRIPTION OF THE DRAWINGS

FIG. 1 is a block diagram of the phase-locked receiver.

FIG. 2 is a more detailed block diagram of the phase-locked receiver.

DETAILED DESCRIPTION OF THE PREFERRED EMBODIMENT

Figure 3:
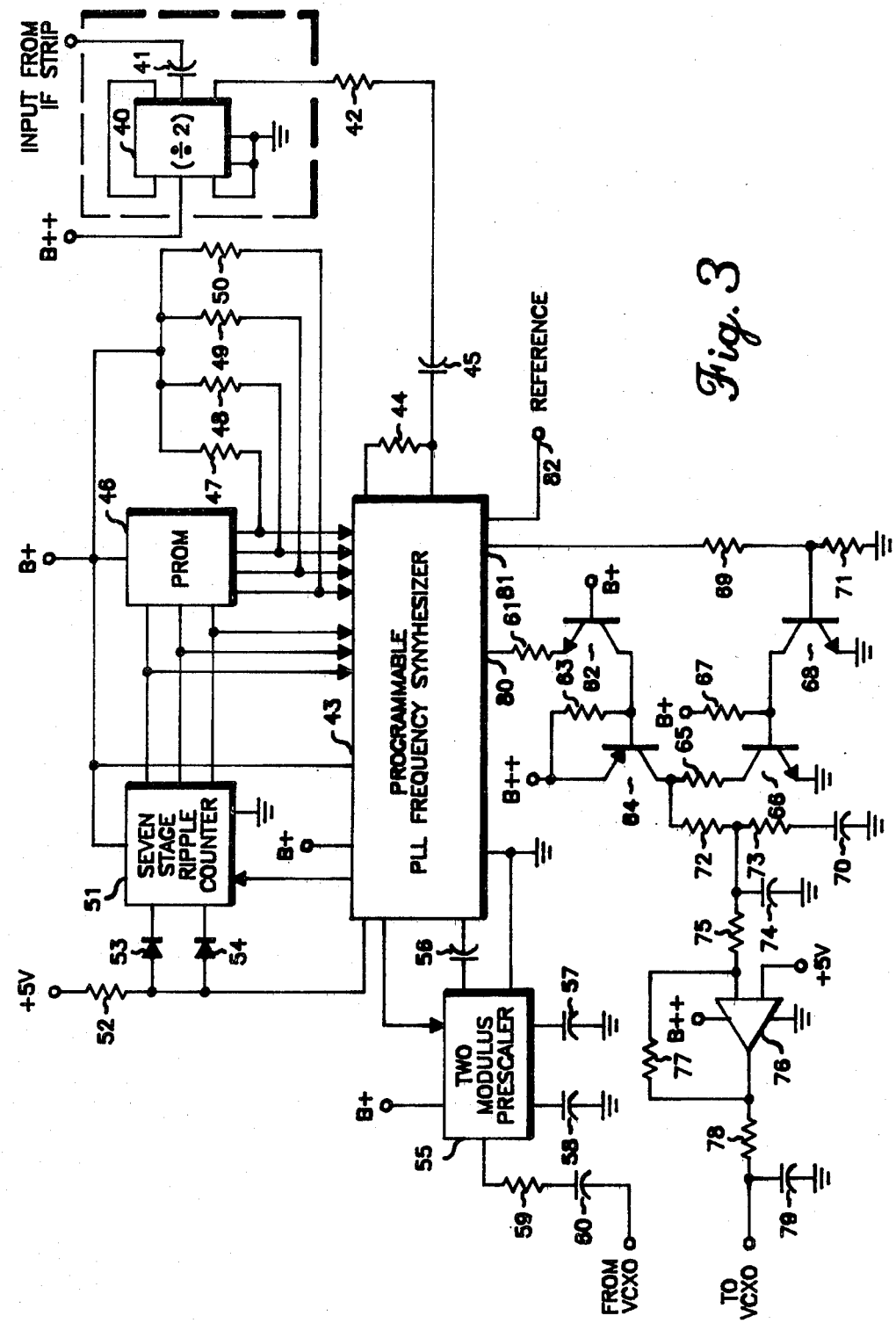
FIG. 3 is an electrical schematic for the phase-locked loop portion of the phase locked receiver of FIG. 2.

Referring now to the drawings, FIG. 1 shows a block diagram of the phase-locked receiver, constructed in accordance with the present invention. The phase locked receiver comprises a receiver wherein a phase-locked loop uses the divided IF frequency for the reference input in the phase-locked loop. A mixer 10, receives one of its inputs from the RF selectivity portion of the receiver (not shown). The output of mixer 10 is coupled to the input of an IF amplifier 8. The output of IF amplifier 8 is coupled to the input of a divider network 11. The output of the IF amplifier 8 is also connected to the input of the discriminator 17 and it is also connected to the reference output 18 of the receiver. The output of divider 11 is connected to the first input terminal of the phase detector 13. The output of the phase detector 13 is connected to a low pass filter 14. The output of the low pass filter 14 is connected to the voltage controlled oscillator 15. The output of the voltage controlled oscillator 15 is connected to the input of multiplier 19 and also to the input of the divider 16. The output of multiplier 19 is connected to a second input of mixer 10. The output of divider 16 is connected to a second input of phase detector 13.

In operation, the RF signal is mixed with a signal from the multiplier 19. The signal generated by the multiplier 19 is controlled so as to be exactly the RF frequency minus the desired intermediate frequency. This will be discussed in more detail. The combination of the two signals at the inputs to the mixer 10 produce the desired intermediate frequency at the output of mixer 10. The intermediate frequency is then amplified and then divided by divider 11. The output of divider 11 is used as the reference frequency for the phase-locked loop. This reference frequency is used by phase detector 13 to produce a signal which is related to the difference between the reference signal and the signal at the output of the divider 16. The output of the phase detector 13 is connected to the voltage controlled oscillator 15 through the low pass filter 14. The voltage controlled oscillator (VCO) 15 produces a signal of variable frequency and is responsive to the phase detector 13. The output of the voltage controlled oscillator, 15 is then multiplied by multiplifer 19 to provide the injection for the mixer 10, and also divided by divider 16 to provide the second input signal to the phase detector 13. This scheme employs the well known process of low side injection, and therefore a stable negative feedback system is formed wherein the frequencies involved have a relationship defined by the equation:

$$f_{IF} = f_{RF} \cdot \frac{1}{1 + \frac{A \times P}{R}}$$

The constants A, P, R are integers and are the divide and multiply ratios of the phase-locked loop and the multiplier of the VCO frequency. Therefore, the IF frequency of the receiver which is used as a reference signal for a simulcast transmitter, is dependent only on the RF carrier signal and the integer divide and multiply ratios used in the phase-locked loop. A stable reference frequency signal for distribution to an additional device can then be derived from a locked portion of the phase-locked receiver. In the preferred embodiment, the reference signal can also be derived from the feedback input of phase detector 13 and is shown at terminal 9 labeled "reference". In an alternate embodiment, the reference signal can be derived from the input terminal of divider 11 and is shown at terminal 18 labeled "reference".

FIG. 2 shows a more detailed block diagram of the phase-locked receiver. In FIG. 2, the RF preselector 20 is connected to the first input of mixer 21. The output of mixer 21 is connected to the input of a first crystal filter 22. The output of crystal filter 22 is connected to the input of a first IF amplifier 23. The output of IF amplifier 23 is connected to the input of a second crystal filter 24. The output of crystal filter 24 is connected to the input of the IF amplifier 25. This configuration is well known in the art and is common in several conventional receivers. The output of IF amplifier 25 is then connected to a divide-by-two divider 27. The output of IF amplifier 25 is also connected to the input of the discriminator 36 and also to a terminal labeled "reference". The output of the divide-by-two counter 27 is connected to the input of a divide-by-M counter 28. The two counters 27 and 28 are shown enclosed by a dashed line 26 to enhance the comparison with the divide-by-R counter 11 of FIG. 2. The output of divide by M counter 28 is connected to the phase detector 29. The output of phase detector 29 is connected to the input of low pass filter 30. The output of low pass filter 30 is connected to the input of a voltage controlled crystal oscillator 31. The output of voltage controlled oscillator 31 is connected to the input of a multiplier and also to the input of a divide-by-(N/N+1) divider 33. The output of divider 33 is connected to the input of a divide-by-K divider 34. One output of divider 34 is connected to an input of divider 33. Dividers 33 and 34 are shown enclosed by a dashed line 35 to enhance the comparison with the divide-by-P divider 16 of FIG. 2. The output of divider 34 is connected to the second input of phase detector 29. The output of the multiplier 32 is connected to the second input of the mixer 21 to complete the loop.

In operation, the RF signal is received by frequency selective preselector 20. The output of the preselector 20 is mixed with the signal generated by multiplier 32. The signal is further processed through a chain of crystal filters and amplifiers described previously to produce a signal of the desired converted frequency. This signal, which is the operating intermediate frequency for the radio, provides a reference frequency for a simulcast transmitter. The signal derived from this signal also provides the reference signal for the phase-lock loop and the multiple of this signal is used for the injection signal for mixer 21.

The reference signal for the phase-lock loop is generated through the electronic dividers 27 and 29. The divider 27 provides a dual function. This divider provides the first stage of processing for the reference signal and also provides a means for reducing the phase-lock loop's frequency emission near the operating intermediate frequency of the receiver. This divider is disposed in a very close proximity to the last IF amplifier 25. This counter produces a square wave output at exactly one-half the intermediate frequency of the receiver. It is well known that square waves comprise only odd order harmonics, and each successive higher order harmonic exhibits a lower amplitude; therefore, the harmonic frequency emission near the operating intermediate frequency of the receiver is dramatically reduced. This feature allows the full gain of the IF amplifier sections to be utilized.

The output of divider 27 is then connected to the input of divider 28. The dividers 27 and 28 are shown enclosed by the dashed-line 26 to enhance the comparison with the divide-by-R divider 11 of FIG. 1. The output of divider 28 comprises the reference signal for the phase-locked loop and is connected to the first input of phase detector 29. Phase detector 29 also receives an input from divider 34. This will be discussed in more detail later. The phase detector 29 produces an output signal which is related to the relative phase of the two inputs. If the output frequency of divider 28 is greater than the frequency output of divider 34, or if the relative phase of divider 34 is lagging that of divider 28, the phase detector will produce positive-going pulses. If the output frequency of divider 28 is less than the output frequency of divider 34, or if the relative phase of divider 34 is leading that of divider 28, the phase detector will produce negative going pulses. If the outputs of dividers 34 and 28 are substantially the same both in frequency and in phase relationship, the phase detector output will switch to a high impedance state.

The output of phase detector 29 is connected to a low-pass filter 30. The low-pass filter 30 produces a DC voltage which is proportional to the output of the phase detector 30. The output of the low-pass filter 30 is connected to a voltage-controlled crystal oscillator 31. This device produces an output of variable frequency responsive to the DC voltage at its input. The voltage-controlled crystal oscillator is designed such that it produces a signal which is a sub-multiple of the desired mixer injection frequency, within a limited range. The output of the voltage-controlled crystal oscillator 31 is connected to multiplier 32 which converts the output signal of the voltage-controlled crystal oscillator into the injection signal required by the mixer 21 through the well-known process of frequency multiplication. The output of the voltage-controlled crystal oscillator is also connected to the input of divider 33. The divider 33, also known as a two-modulus pre-scaler, is responsive to an output of divider 34. The operation of these two dividers will be discussed in more detail later. The output of divider 34 is connected to an input of the phase detector 29. The specific divide ratios of dividers 28, 33 and 34 are regulated by the desired RF and IF frequencies according to the following relationship:

$$f_{IF} = f_{RF} \cdot \frac{1}{1 + \frac{A \times P}{R}}$$

One embodiment of the present invention requires that the receiver lock to an RF carrier of 76.5 MHz. There are a plurality of combinations of divide and multiply ratios which will function satisfactorily, but in the preferred embodiment, the following parameters were chosen. Assuming low-side injection is used and 76.5 MHz is the desired RF frequency, and IF frequency of 5.26 MHz is desired, then the phase lock loop must generate a frequency of 71.240 MHz for the mixer injection. If a multiplier of A=6 is chosen, then the voltage-controlled oscillator must produce a signal of 11.873 MHz. A further constraint of the receiver requires that the receiver be tuned to an adjacent channel by incrementing the divide ratio divider P. Therefore, the required divide ratios are selected to be the following values: R=1578, P=3562, A=6. It will be clear to one skilled in the art that the phase detector's operating frequency will be 3.33 KHz, and these operating values will provide a phase-locked receiver which will receive an RF signal of 76.5 MHz. As previously described, the reference signal for distribution to additional devices can be derived from the signal at terminals 37 or 38.

The phase-locked receiver can be constructed from standard pre-packaged electronic components. The divide ratios required by the divide-by-P divider are quite large and, therefore, divider 34 is preceded by a device known as a two-modulus pre-scaler. The two-modulus pre-scaler exhibits two distinct divide ratios and is responsive to divider 34. This common technique allows a flexibility in the configuration of the phase lock loop which would be difficult to achieve otherwise.

Referring now to FIG. 3, an electrical schematic for the phase-locked loop portion of the phase-locked receiver is shown. FIG. 3 shows a programmable phase-locked loop frequency synthesizer 43 which is a large scale integrated circuit commercially available from Motorola, Inc., Part No. MC145146. The programmable phase-locked loop frequency synthesizer is a universal multiple function integrated circuit comprising a 12-bit programmable reference divider, a digital phase detector, a 10-bit programmable divide-by-N counter, a 7-bit divide-by-A counter and the necessary latch circuitry for accepting the 4-bit input data. Several commercially available integrated circuits would perform satisfactorily, but this device is especially convenient in this application. The exact pin configuration will be obvious to one skilled in the art by referring to the readily available data sheets for this devoce.

Briefly described, the PLL frequency synthesizer 43 is connected to a divide-by-2 divider 40. The divide-by-2 divider 40 receives its input directly from the last IF amplifier through the coupling capacitor 41. The divide-by-2 output is then connected to the PLL synthesizer through the coupling capacitor 45 and resistors 42 and 44. The divide-by-2 divider would be disposed in close proximity to the last IF amplifier and would be enclosed by a common shield can with the last IF amplifier and discriminator (not shown). The divide-by-2 divider may be of the Motorola type MC14013, although several other available dividers may well function satisfactorily.

The phase-locked loop frequency synthesizer 43 contains several programmable dividers, and, therefore, it must be instructed as to which divide ratios to use. The PROM 46 contains the information which instructs the PLL frequency synthesizer 43 as to which specific divide ratios to use. The output lines of PROM 46 are connected to the address inputs of the PLL frequency synthesizer and may be of the Signetics type 82S126. The output lines of PROM 46 are also connected to pull-up resistors 47, 48, 49 and 50. The input lines of PROM 46 are connected to the output lines of 7-stage ripple counter 51. The output lines of the 7-stage ripple counter are also connected to the address lines on the programmable PLL frequency synthesizer 43. The PLL frequency synthesizer 43 receives two inputs from the ripple counter 51 through diodes 53 and 54. The seven stage ripple counter may be of the Motorola type MC14024.

The PLL frequency synthesizer 43 generates two phase detector output signals which are connected to a signal conditioning network which combines the signals used to drive the voltage-controlled crystal oscillator. The first output 81, representing a phase detector output, pulses high during a specific phase condition. This output is connected to a resistor 69 which is connected to the base of an NPN transistor 68. The base of transistor 68 and is also connected to a resistor 71, in turn connected to ground at one terminal. The emitter of transistor 68 is also connected to ground. The collector of transistor 68 is connected to the base of transistor 66 and to one terminal of resistor 67. The second terminal of resistor 67 is connected to the B+ power source. The emitter of transistor 66 is connected to ground. The collector of transistor 66 is connected to a terminal of resistor 65.

The second phase detector output 80 produces negative-going pulses during a specific phase condition and is connected to the emitter of transistor 62 through a resistor 61. The base of transistor 62 is connected to the B+ power supply. The collector of transistor 62 is connected to the base of the PNP transistor 64 and also to one terminal of resistor 63. The second terminal of resistor 63 and the emitter of transistor 64 are connected to a B++ power supply. The collector of transistor 64 is connected to the second terminal of resistor 65. The second terminal of resistor 65 comprises the combined output of the phase detector portion of the PLL frequency synthesizer 43 and depending on the specific phase inputs, will exhibit a waveform of negative-going pulses or positive-going pulses. If the inputs to the phase detector are substantially the same, no signal will be present at this second terminal of resistor 65. The signal at the second terminal of resistor 65 is then coupled to an input of an operational amplifier 76 through a network of resistors 72, 73 and 75 and capacitors 70 and 74. These components form a low-pass filter and perform the function of the low-pass filter 30 in FIG. 2.

The operational amplifier 76 is connected to the B+ power supply and also ground. A resistor 77 is connected from the input to the output of the operational amplifier 76 provides feedback and controls the gain of operational amplifier 76. The output of operational amplifier 76 is connected to the first terminal of resistor 78. The second terminal of resistor 78 is connected to a capacitor 79 and also to the voltage-controlled crystal oscillator. The resistor 78 and capacitor 79 form a low pass filter and provide additional filtering to the phase detector output waveform.

Briefly described, the programmable PLL frequency synthesizer contains one phase detector. The inputs to the phase detector are designated $f_v$ and $f_r$, such as that reference in FIG. 2. The $f_r$ signal comprises the reference signal utilized by the phase-locked loop. If the frequency of $f_v$ is greater than the frequency of $f_r$ or if the phase of $f_v$ is leading that of $f_r$ then output 81 pulses low while output 80 remains essentially high. If the frequency of $f_v$ is less than $f_r$ or if the phase of $f_v$ is lagging that of $f_r$, then output 80 will produce negative-going pulses while output 81 remains essentially high. If the frequency and phase of $f_v$ and $f_r$ are substantially the same, outputs 80 and 81 remain essentially high. These two phase detector outputs are combined through transistors 62, 64, 66 and 68 to provide a single phase detector output. When output 81 pulses low, transistor 68 switches to a nonconducting state and resistor 67 provides the base of transistor 66 with drive current to switch the transistor on. When the base of transistor 66 is active, the collector of transistor 66 saturates and swings low. Therefore, when the PLL frequency synthesizer 81 pulses low, the collector of transistor 66 also swings low.

When the PLL synthesizer output 80 swings low, transistor 62 becomes active and the collector of 62 saturates, thereby allowing transistor 64 to become active and current is sourced to resistor 72, developing a positive voltage. In other words, when PLL frequency synthesizer output 80 pulses low, a positive-going pulse is developed across resistor 72. Assuming the PLL frequency synthesizer output 80 is active, positive-going pulses will appear across resistor 72. As this occurs, gradually increasing positive voltage will develop across capacitors 74 and 70. If the PLL frequency synthesizer output 81 is active, negative-going pulses appear across resistor 72 and a gradually decreasing voltage will develop across capacitors 70 and 74.

The operational amplifier 76 converts the voltages developed across capacitors 74 and 70 into levels compatible with the voltage-controlled crystal oscillator.

The operational amplifier used in the preferred embodiment is of the type LM741 available from National Semiconductor and transistors 62, 64, 66 and 68 can be any general purpose switching transistors.

The programmable PLL frequency synthesizer 43 also receives an input from a two modulus prescaler 55. An output of the voltage-controlled crystal oscillator is connected to the input of the two modulus prescaler 55 through the coupling network formed by the capacitor 60 and resistor 59. The two-modulus prescaler 35 may be of the Motorola type MC3393. The prescaler 55 is also connected to the B+ power supply, and two capacitors 58 and 57 are connected from the prescaler to ground. An input to the two modulus prescaler 55 is responsive to an output from the programmable PLL frequency synthesizer.

In operation, the PLL synthesizer 43 incorporates an on-chip programmable divider to generate the feedback frequency for the PLL phase detector. The voltage-controlled crystal oscillator generates a signal which exceeds the range of the on-chip divider and, therefore, an additional divider stage is placed before the input to the PLL frequency synthesizer 43. Additional flexibility is showed by utilizing a prescaler device which can divide by even and odd integers, thus allowing an even or odd divide ratio to be utilized in the phase-locked loop. The exact operation of two modulus prescaler can be obtained by referring to the data sheets readily available for this device.

In general, the programmable PLL programmable frequency synthesizer 43 receives the divided IF frequency from divider 40 which is then processed by an on-chip programmable divider. The exact divider ratios are stored in PROM 46. The seven-stage ripple counter 51 sequences the address information at the address inputs to the PROM 46 and to the address inputs of PLL frequency synthesizer. The diodes 53 and 54 and resistor 52 are connected to the PLL frequency synthesizer and also to the seven-stage ripple counter. This line, when high, will enter the data appearing on the output of PROM 46 and when low will latch the information into the PLL frequency synthesizer.

The programmable dividers then function as previously described. The divided reference frequency derived from the IF frequency is compared with the divided feedback frequency through the phase detector, and an error signal is generated. The error signal is converted to a DC voltage and is used to steer the voltage-controlled crystal oscillator which is designed to generate a signal which is a sub-multiple of the required injection frequency used by the first mixer. A reference frequency for distribution to additional devices is derived from the feedback input of the phase detector and corresponds to the $f_v$ input of phase detector 24 of FIG. 2. The reference output is shown at the terminal 82 labeled "reference".

Figure 4:
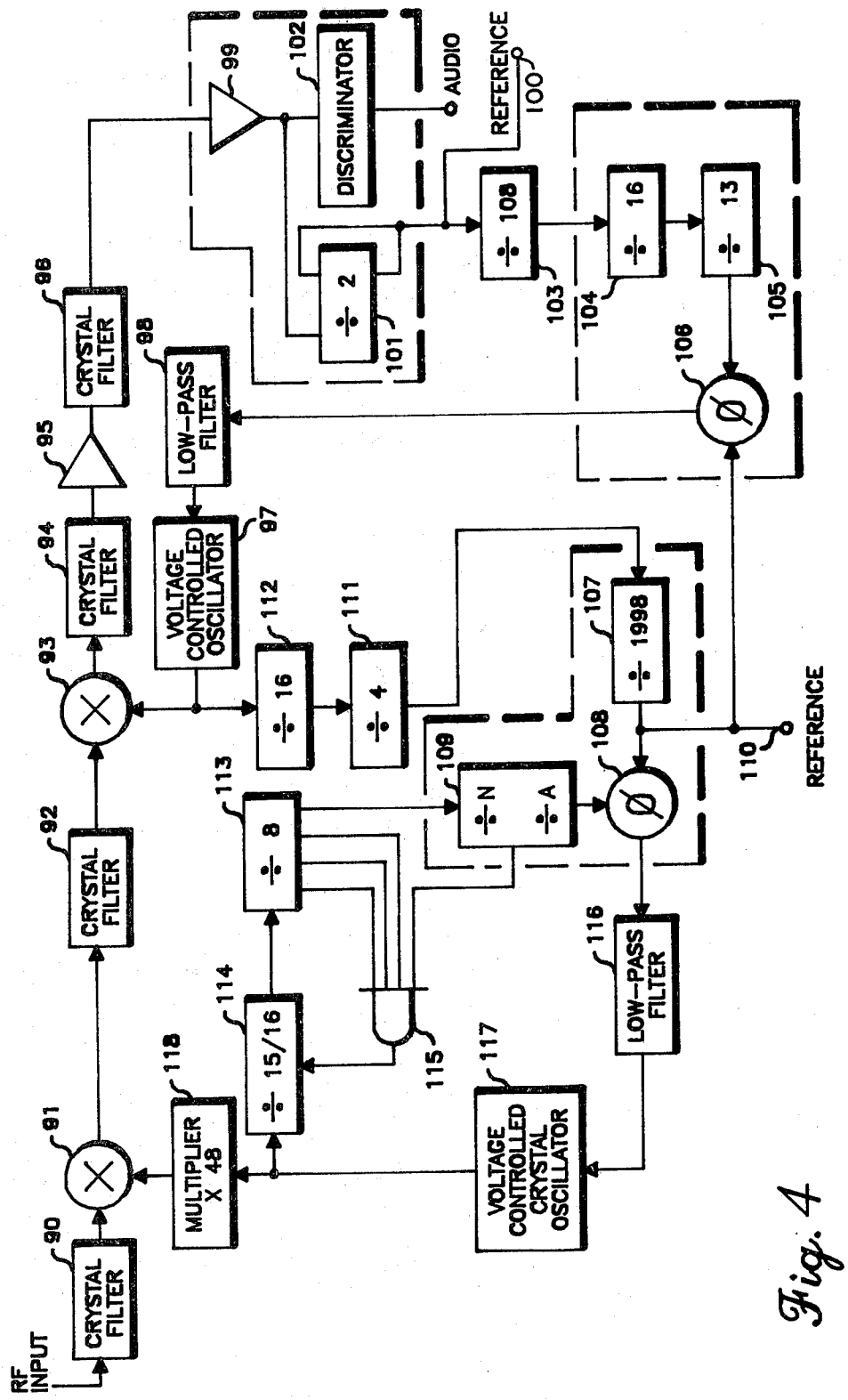
FIG. 4 is a block digram of a dual loop phase-locked receiver.

FIG. 4 shows an alternate embodiment of the present invention and is configured as a dual-conversion phase-locked receiver. Dual conversion receivers are well known in the art, and the technique employs two mixer stages with the injection signal of both mixers being phase-locked to the RF carrier signal.

The operation of the circuit of FIG. 4 is similar to the circuit previously described with the addition of a second phase-locked loop which uses a divided reference signal derived from the injection oscillator of the second mixer. The output of the second phase-locked loop is used as the injection signal of the first mixer.

As before, the signal is processed by a crystal filter 90. The output of filter 90 is connected to the first input of mixer 91. The output of mixer 91 is connected to the input of a second crystal filter 92. The outpt of crystal filter 92 is connected to the input of a second mixer 93. The output of mixer 93 is connected to a crystal filter 94 which is connected to the input of an IF amplifier 95. The outpt of amplifier 95 is connected to a crystal filter 96. The output of filter 96 is fed to a final IF amplifier 99 which has outputs connected to the discriminator 102 and to the divide-by-two divider 101. The output of divider 101 provides the basic reference for both phase-locked loops and is similar in operation to divider 40 in FIG. 3. The signal is further processed by dividers 103, 104 and 105 whose specific divide ratios are fixed by the constraints of the particular frequency one would like to receive. The output of divider 105 is connected to phase detector 106. The output of phase detector 106 is connected to the input of the low-pass filter 98 which, in turn, provides the DC voltage used to control the voltage-controlled oscillator 97. The output of voltage-controlled oscillator 97 provides the injection signal for the second mixer 93. The output of oscillator 97 is also processed through dividers 112, 111 and 107 which provide the reference signal for the second phase-locked loop connected to the phase detector 108 and the feedback signal for the first phase-locked loop.

The output of the phase detector 108 is connected to the input of the low-pass filter 116 which generates the control voltage utilized by the second voltage-controlled oscillator 117. The output of the voltage-controlled oscillator 117 is frequency multiplied and provides the injection signal for the first mixer 91. The output of the voltage-controlled crystal oscillator 117 is also processed through dividers 114, 113, 115 and 109 to provide the feedback frequency for the second input of the second phase detector 108.

The divider 114 can be compared to the two-modulus prescaler 55 of FIG. 3 and divider 109 can be compared with divider 34 of FIG. 2. Divider 113 serves to increase the range of the divider 109 which in practice is a section of a large scale integrated circuit such as the one described in FIG. 3. The AND gate 115 is used to gate the modulus control output of divider 109 to insure the modulus control line switches during the proper cycle.

As in the previous embodiment, the reference frequency for a simulcast transmission system could be derived from the output of the divide-by-2 divider 101 or from the feedback input of the second phase detector 106.

The foregoing embodiments have been intended as illustrations of the principles of the present invention. Accordingly, other modifications, uses and embodiments will be apparent to one skilled in the art without departing from the spirit and scope of the principles of the present invention.

We claim:

1. An improved phase-locked receiver for deriving a reference signal from a received RF carrier signal, including in combination:
    means for converting the received RF carrier signal into a desired IF frequency;
    means coupled to said converting means for amplifying said IF frequency;
    frequency multiplying means coupled to said frequency converting means;
    first frequency divider means coupled to said amplifying means;
    phase-locked loop means including phase detector means, low pass filter means and voltage controlled oscillator means and coupled between said frequency multiplying means and said first divider means;
    said first divider means providing a first input to said phase detector means; and
    second frequency divider means coupled between said frequency multiplying means and a second input of said phase detector means, whereby, a derived reference signal is provided at a terminal of said phase-locked receiver.

2. The apparatus of claim 1 wherein said phase-locked receiver employs single frequency conversion.

3. The apparatus of claim 1 wherein said first frequency divider means includes an even integer divider.

4. The apparatus of claim 3 wherein said even integer divider is disposed in close physical proximity to said IF amplifying means.

5. The apparatus of claim 1 wherein said derived reference signal is taken from an output of the second frequency divider means.

6. The apparatus of claim 1 wherein said derived reference signal is taken from an output of said first frequency divider means.

7. An improved phase-locked receiver for deriving a reference signal from a received carrier signal including in combination:
    first means for converting a received carrier frequency into a desired first IF frequency;
    second converting means for converting said first IF frequency into a second IF frequency coupled to said first converting means;
    IF amplifying means coupled to said second converting means;
    first phase-locked loop means including phase detector means, low-pass filter means, voltage-controlled oscillator means and first frequency divider means;
    second frequency divider means coupled to said IF amplifying means;
    said first phase-locked loop means coupled between said second frequency divider means and said second converting means;
    frequency multiplier means coupled to said first frequency converting means;
    second phase-locked loop means including phase detector means, low-pass filter means, voltage-controlled oscillator means and third frequency divider means; and
    said second phase-locked loop means coupled between said first frequency divider means and said frequency multiplier means, whereby a derived reference signal is provided at a terminal of said phase-locked receiver.

8. The apparatus of claim 7 wherein a portion of said second frequency divider means is an even integer divider.

9. The apparatus of claim 8 wherein said even integer divider means is disposed in close physical proximity to said IF amplifying means.

10. The apparatus of claim 7 wherein said reference signal is derived from an output of said second frequency divider means.

11. The apparatus of claim 7 wherein said reference signal is derived from an output of said first frequency divider means of said first phase-locked loop means.

12. A method for deriving and outputting a reference signal from a received RF carrier signal, in a phase-locked receiver including the steps of:
    converting the received RF carrier signal into a desired IF frequency;
    amplifying said IF frequency;
    dividing the amplified IF frequency by a predetermined integer controlling a voltage controlled oscillator signal by phase comparing the amplified and divided IF frequency and a first signal and then low-pass filtering the phase comparison result;
    multiplying up the frequency of the voltage controlled oscillator signal by a predetermined integer to obtain a signal at a desired frequency for performing said converting step; and
    dividing the frequency of the voltage controlled oscillator signal to provide said first signal;
    outputting either said amplified and divided IF frequency or said first signal as a reference signal.

13. The method of claim 12 wherein dividing the amplified IF frequency includes dividing the amplified IF frequency by an even integer.

14. The method of claim 13 wherein dividing by an even integer is effected at a location in close physical proximity to amplifying said IF frequency.

* * * * *